US006647471B2

(12) United States Patent
March et al.

(10) Patent No.: US 6,647,471 B2
(45) Date of Patent: Nov. 11, 2003

(54) METHODS FOR OVERWRITING DATA IN A MEMORY DEVICE

(75) Inventors: Roger W. March, Santa Clara, CA (US); Christopher S. Moore, San Jose, CA (US); Daniel T. Brown, Seattle, WA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/253,089

(22) Filed: Sep. 23, 2002

(65) Prior Publication Data
US 2003/0028734 A1 Feb. 6, 2003

Related U.S. Application Data

(60) Division of application No. 09/748,589, filed on Dec. 22, 2000, which is a continuation-in-part of application No. 09/662,953, filed on Sep. 15, 2000, now abandoned.

(51) Int. Cl.[7] .......................... G06F 11/08; G06F 12/00
(52) U.S. Cl. ........................ 711/154; 711/102; 714/6
(58) Field of Search ...................... 711/102, 103, 711/101, 154, 156; 713/200; 714/6, 7, 746

(56) References Cited

U.S. PATENT DOCUMENTS

| 4,646,266 A | 2/1987 | Ovshinsky et al. ......... 365/105 |
| 5,029,125 A | 7/1991 | Sciupac ....................... 707/205 |

(List continued on next page.)

FOREIGN PATENT DOCUMENTS

| EP | 0 073 486 A2 | 3/1983 |
| EP | 1 017 100 A1 | 7/2000 |
| EP | 1 168 150 A1 | 2/2002 |
| WO | WO 99/14763 | 8/1998 |

OTHER PUBLICATIONS

Zhang, Ph.D., Guobiao, "3D–ROM—A First Practical Step Towards 3D–IC—Semiconductor International," Jul. 2000, pp. 1–7.

The Norton Desktop (Version 3 for Windows), User's Guide, 1993, pp. 16-1–16-6.

NN8803151, IBM Technical Disclosure Bulletin, "Incremental Directory Indexes for Write–Once Media", Mar., 1988, vol. 30, Issue 10, pp. 151–155.

"Jack St. Clair Kilby," Jones Telecommunications & Multimedia Encyclopedia, http://www.digitalcentury.com/encyclo/update/kilby.html, 4 pages (1999).

(List continued on next page.)

Primary Examiner—Gary Portka
(74) Attorney, Agent, or Firm—Brinks Hofer Gilson & Lione

(57) ABSTRACT

The preferred embodiments described herein provide a memory device and methods for use therewith. In one preferred embodiment, a method is presented for using a file system to dynamically respond to variability in an indicated minimum number of memory cells of first and second write-once memory devices. In another preferred embodiment, a method for overwriting data in a memory device is described in which an error code is disregarded after a destructive pattern is written. In yet another preferred embodiment, a method is presented in which, after a block of memory has been allocated for a file to be stored in a memory device, available lines in that block are determined. Another preferred embodiment relates to reserving at least one memory cell in a memory device for file structures or file system structures. A memory device is also provided in which file system structures of at least two file systems are stored in the same memory partition. Additionally, methods for permanently preventing modification of data stored in a memory device and for identifying memory cells storing data are disclosed.

17 Claims, 7 Drawing Sheets

U.S. PATENT DOCUMENTS

| | | | | |
|---|---|---|---|---|
| 5,065,389 A | * | 11/1991 | Roth | 369/47.18 |
| 5,119,291 A | | 6/1992 | Flannagan et al. | 711/4 |
| 5,241,659 A | | 8/1993 | Parulski et al. | 345/589 |
| 5,313,425 A | | 5/1994 | Lee et al. | 365/201 |
| 5,315,178 A | | 5/1994 | Snider | 326/44 |
| 5,321,824 A | | 6/1994 | Burke et al. | 711/220 |
| 5,432,729 A | | 7/1995 | Carson et al. | 365/63 |
| 5,437,028 A | | 7/1995 | Iijima | 707/205 |
| 5,448,372 A | | 9/1995 | Axman et al. | 386/124 |
| 5,448,728 A | | 9/1995 | Takano et al. | 707/205 |
| 5,469,450 A | | 11/1995 | Cho et al. | 714/766 |
| 5,469,451 A | | 11/1995 | Henmi | 714/766 |
| 5,559,732 A | | 9/1996 | Birge | 365/120 |
| 5,559,778 A | | 9/1996 | Inokuchi et al. | 369/53.24 |
| 5,708,667 A | | 1/1998 | Hayashi | 714/755 |
| 5,761,741 A | | 6/1998 | Robbins et al. | 711/212 |
| 5,784,391 A | | 7/1998 | Konigsburg | 714/773 |
| 5,796,694 A | | 8/1998 | Shirane | 369/59.25 |
| 5,835,396 A | | 11/1998 | Zhang | 365/51 |
| 5,835,509 A | | 11/1998 | Sako et al. | 714/755 |
| 5,890,169 A | | 3/1999 | Wong et al. | 707/206 |
| 5,915,167 A | | 6/1999 | Leedy | 438/108 |
| 5,943,254 A | | 8/1999 | Bakeman, Jr. et al. | 365/72 |
| 6,000,023 A | | 12/1999 | Jeon | 711/173 |
| 6,016,269 A | | 1/2000 | Peterson et al. | 365/171 |
| 6,034,882 A | | 3/2000 | Johnson et al. | 365/103 |
| 6,052,816 A | | 4/2000 | Yoshinogawa | 714/766 |
| 6,108,236 A | | 8/2000 | Barnett | 365/185.09 |
| 6,185,122 B1 | | 2/2001 | Johnson et al. | 365/103 |
| 6,208,545 B1 | | 3/2001 | Leedy | 365/51 |
| 6,216,247 B1 | | 4/2001 | Creta et al. | 714/763 |
| 6,236,587 B1 | | 5/2001 | Gudesen et al. | 365/105 |
| 6,321,358 B1 | | 11/2001 | Anderson | 714/763 |
| 6,321,360 B1 | * | 11/2001 | Takeuchi et al. | 714/766 |
| 6,377,526 B1 | * | 4/2002 | Vining et al. | 369/53.1 |
| 2002/0034105 A1 | | 3/2002 | Kulkarni et al. | 365/200 |

OTHER PUBLICATIONS

"The 'Chip' Inventors (part 1)," Dan Murray, http://www.livingstonmontana.com/access/dan/150thechipinventors–1.html, 3 pages (1999).

T. R. Reid, "The Chip: How Two Americans Invented the Microchip and Launched a Revolution," pp. 22–23 (1984).

"About Jack" http://www.ti.com/corp/docs/kilbyctr/jack-built.shtml, 6 pages (2002).

"Definition: integrated circuit," http://www.its.bldrdoc.gov/fs–1037/dir–019/_2755.htm, 1 page (1996).

Meindl, "Definitions of Terms for Integrated Electronics," IEEE Journal of Solid–State Circuits, p. 2 (Mar. 1967).

Muller et al., "Device Electronics for Integrated Circuits," second edition, pp. 65 and 106 (1986).

"3D–ROM—A First Practical Step Towards 3D–IC," Zhang, 7 pages, Jul. 2000.

"Construction Techniques for Systematic SEC–DED Codes with Single Byte Error Detection and Partial Correction Capability for Computer Memory Systems," Penzo et al., IEEE Transactions on Information Theory, vol. 41, No. 2, Mar. 1995, pp. 584–591.

"New Direct CD 2.5 Improves Speed and Reliability of Data Archiving Using CD–R/CD–RW," http://www.adaptec.com/worl . . . pany/pressrelease.html?prodkey=08051998, 2 pages, Aug. 5, 1998.

"Universal Disk Format (UDF) Driver," http://www.trylinux.com/projects/udf/index.html, 3 pages (1999).

"FAT File Allocation Table," http://www.easydesksoftware.com/fat.htm, 2 pages, Oct. 24, 1999.

"FAT File Allocation Table," http://www.oreilly.com/reference/directory/terms/F/File_Allocation_Table.htm, 4 pages (1996).

"ISO9960 Simplified for DOS/Windows by Philip J. Erdelsky," http://www.alumni.caltech.edu/~pje/iso9660.html, 8 pages Aug. 26, 2000.

"Memory cards: designing with a full deck," http://www.ednmag.com/ednmag/reg/2000/052520000/11dfl.htm, 12 pages, May 25, 2000.

"DOS Disk Formats," http://www.qvctc.commnet.edu/classes/csc277/formats.html, 7 pages (1999).

"MS–DOS Partitioning Summary," http://www.qvctc.commnet.edu/classes/csc277/fdisk2.html, 3 pages (1999).

"DOS Partitions," http://www.qvctc.commnet.edu/classes/csc277/partitions.html, 5 pages (1999).

"DOS Disk Structures–Definitions," http://www.qvctc.commnet.edu/classes/csc277/formats2.html, 3 pages (1999).

"MS–DOS Summary A Survival Guide," http://www.washtenaw.cc.mi.us/dept/cis/mod/q02cd.htm, 10 pages (1996).

"Hardware White Paper, FAT: General Overview of On–Disk Format," Microsoft Corp., 25 pages, May 5, 1999.

"Method for Deleting Stored Digital Data from Write–Once Memory Device," U.S. patent application Ser. No. 09/638,439, filed Aug. 14, 2000; inventors: Christopher S. Moore, Derek J. Bosch, Daniel C. Steere, and J. James Tringali.

"Method for Storing Digital Information in Write–Once Memory Array," U.S. patent application Ser. No. 09/727,229, filed Nov. 30, 2000; inventors: David R. Friedman Derek J. Bosch, Christopher S. Moore, J. James Tringali, and Michael A. Vyyoda.

"Three–Dimensional Memory Array and Method of Fabrication," U.S. patent application Ser. No. 09/560,626, filed Apr. 28, 2000; inventor: Johan Knall.

"Write–Once Memory Array Controller, System, and Method," U.S. patent application Ser. No. 09/638,427, filed Aug. 14, 2000; inventors: Derek J. Bosch, Christopher S. Moore, Daniel C. Steere, and J. James Tringali.

"Low–Cost Three–Dimensional Memory Array," U.S. patent application Ser. No. 09/638,428, filed Aug. 14, 2000; inventors: Mark G. Johnson, Thomas H. Lee, Vivek Subramanian, and P. Michael Farmwald.

"Modular Memory Device," U.S. patent application Ser. No. 09/638,334, filed Aug. 14, 2000; inventors: J. James Tringali, P. Michael Farmwald, Thomas H. Lee, Mark G. Johnson, and Derek J. Bosch.

"The MS–DOS Filesystem," http://www.cs.adfa.oz.au/teaching/studinfo/osrts/Lectures/node113.html, 2 pages Mar. 1, 2001.

"Computer Engineering: Hardware Design," M. Morris Mano, Chapter 6–4 Error Detection and Correction, pp. 199–202 (1988).

"Symantec The Norton Desktop User's Guide," Chapter 16 "Using Shredder," 8 pages (1993).

"Reed–Solomon Codes," http://www.4i2i.com/reed_solomon_codes.htm, 8 pages (1998).

"Linux System Administration—White Papers," Kirch et al., pp. 291–292 (1996).

"Undocumented DOS Second Edition—A Programmer's Guide to Reserved MS–DOS® Functions and Data Structures," Schulman et al., pp. 408–413 (1994).

"Universal Serial Bus Specification—Revision 2.0," pp. 287–289 (Apr. 27, 2000).

"UNIX chmod command," http://www.psc.edu/general/unix/chmod.html, 1 page (Nov. 13, 1999).

"Universal Disk Format® Specification—Revision 2.01," Optical Storage Technology Association, p. 25 (Mar. 15, 2000).

"Jack St. Clair Kilby," Jones Telecommunications & Multimedia Encyclopedia, http://www.digitalcentury.com/encyclo/update/kilby.html, 4 pages (1999).

"The 'Chip' Inventors (part 1)," Dan Murray, http://www.livingstonmontana.com/access/dan/150thechipinventors-1.html, 3 pages (1999).

T. R. Reid, "The Chip: How Two Americans Invented the Microchip and Launched a Revolution," pp. 22–23 (1984).

"About Jack" http://www.ti.com/corp/docs/kilbyctr/jack-built.shtml, 6 pages (2002).

"Definition: integrated circuit," http://www.its.bldrdoc.gov/fs–1037/dir–019/_2755.htm, 1 page (1996).

Meindl, "Definitions of Terms for Integrated Electronics," IEEE Journal of Solid–State Circuits, p. 2 (Mar. 1967).

Muller et al., "Device Electronics for Integrated Circuits," second edition, pp. 65 and 106 (1986).

* cited by examiner

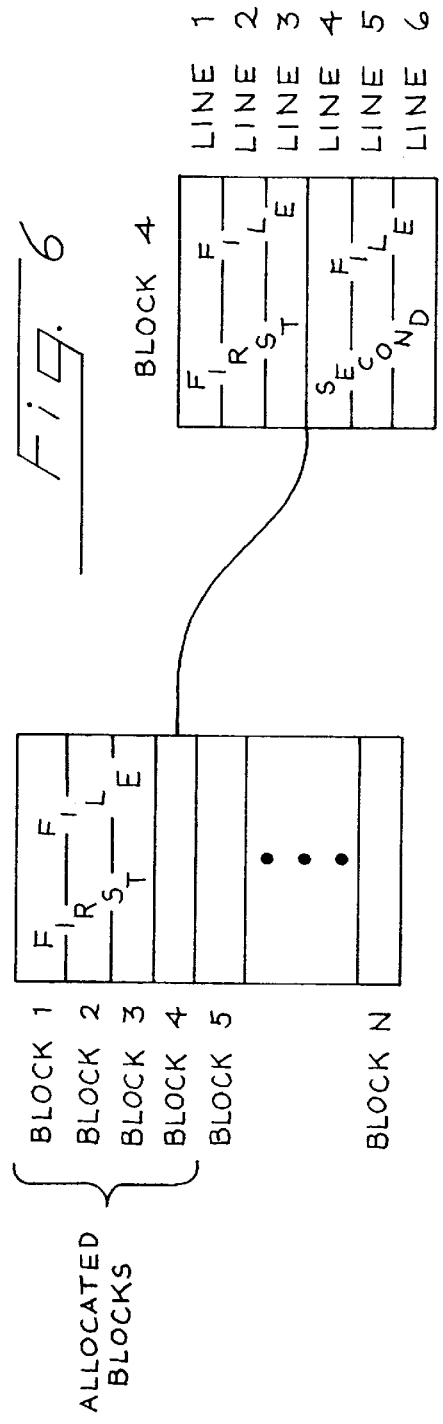
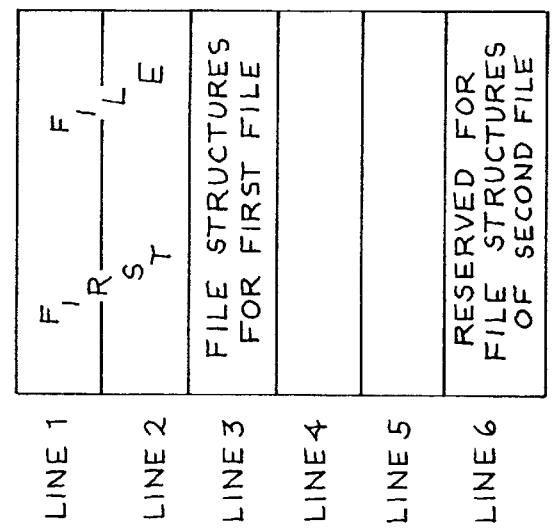
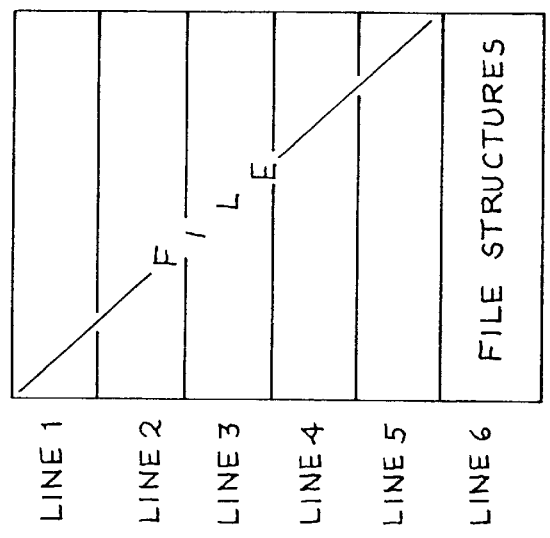

METHODS FOR OVERWRITING DATA IN A MEMORY DEVICE

CROSS-REFERENCE TO RELATED APPLICATIONS

This application is a divisional of application Ser. No. 09/748,589, filed Dec. 22, 2000 (pending), which is a continuation-in-part of U.S. patent application Ser. No. 09/662,953, filed Sep. 15, 2000 (now abandoned), each of which is incorporated by reference herein.

BACKGROUND

Non-volatile memory is becoming standard in many data storage systems such as digital cameras and digital audio players. Modular, portable memory devices, such as flash memory devices, are available that can be readily connected to and disconnected from these systems. CD-based media is also used. Regardless of the type of memory device employed, data storage systems use a file system to control where data is located on the device and to interface with the device. Many data storage systems use the DOS FAT file system. Because the DOS FAT file system requires that the memory device be re-writeable, the DOS FAT file system is not preferred for write-once memory devices. While there are file systems designed for write-once memory devices, such as the ISO9660 file system used by CD-ROMs and the Universal Disk Format (UDF) used by Adaptec for multi-session CD-RWs, these file systems may not be suitable for certain applications.

SUMMARY

The present invention is defined by the following claims, and nothing in this section should be taken as a limitation on those claims.

By way of introduction, the preferred embodiments described below provide memory devices and methods for use therewith. In one preferred embodiment, a method is presented for using a file system to dynamically respond to variability in an indicated minimum number of memory cells of first and second write-once memory devices. In another preferred embodiment, a method for overwriting data in a memory device is described in which an error code is disregarded after a destructive pattern is written. In yet another preferred embodiment, a method is presented in which, after a block of memory has been allocated for a file to be stored in a memory device, available lines in that block are determined. Another preferred embodiment relates to reserving at least one memory cell in a memory device for file structures or file system structures. A memory device is also provided in which file system structures of at least two file systems are stored in the same memory partition. Additionally, methods for permanently preventing modification of data stored in a memory device and for identifying memory cells storing data are disclosed.

It should be noted that the following preferred embodiments can be practiced with any suitable memory device and that the following claims should not be read as requiring a write-once memory device or a three-dimensional write-once memory device unless specifically recited. It should also be noted that any or all of the following embodiments can be used alone or in combination.

The preferred embodiments will now be described with reference to the attached drawings.

BRIEF DESCRIPTION OF THE DRAWINGS

FIG. 6 is an illustration of a memory array of a preferred embodiment in which part of a memory block is filled with a first file and the remainder of the block is filled with a second file.

FIGS. 7a, 7b, and 7c are illustrations of how file structures of a file are reserved in a memory device of a preferred embodiment.

DETAILED DESCRIPTION OF THE PRESENTLY PREFERRED EMBODIMENTS

Introduction

Figure 1:
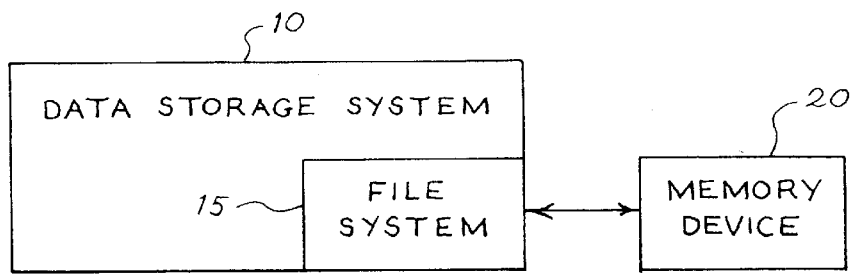
FIG. 1 is a block diagram of a data storage system and memory device of a preferred embodiment.

Turning now to the drawings, FIG. 1 shows a data storage system 10 coupled with a memory device 20. The data storage system 10 comprises a file system 15 operative to read and write data from/to the memory device 20. A data storage system can take any suitable form and may, for example, be implemented as a digital camera, a digital audio player, a personal digital assistant, a game player, a cellular telephone, an electronic book, or a general-purpose programmable computer. The memory device can also take any suitable form and, in one presently preferred embodiment, takes the form of a three-dimensional write-once memory device. Suitable three-dimensional write-once memory devices are described in U.S. Pat. No. 6,034,882, U.S. patent application Ser. No. 09/560,626 (abandoned), and U.S. patent application Ser. No. 09/638,428 (abandoned), all of which are assigned to the assignee of the present invention and are hereby incorporated by reference. Further details regarding alternative structures for the memory device are presented in U.S. patent applications Ser. Nos. 09/638,427 (now U.S. Pat. No. 6,424,581) and 09/638,334 (pending), both of which are assigned to the assignee of the present application and are hereby incorporated by reference.

Three-dimensional write-once memory arrays provide important economies in terms of reduced size of the memory array and associated reductions in manufacturing cost. The cost advantages are important in consumer products such as digital cameras, digital audio players, and electronic books. In these applications, the write-once memory array is preferably field programmable, and the data storage system field programs the memory array with a desired digital medium, such as a file of one or a sequence of images, a text file such as that suitable for an electronic book, or a digital audio file.

The following preferred embodiments can be practiced with any suitable memory device, and the following claims shall not be read as requiring a write-once memory device or a three-dimensional write-once memory device unless specifically recited. Also, it should be noted that any or all of the following embodiments can be used alone or in combination. Further, definitions stated in one section of the detailed description apply equally to all sections.

Figure 2:
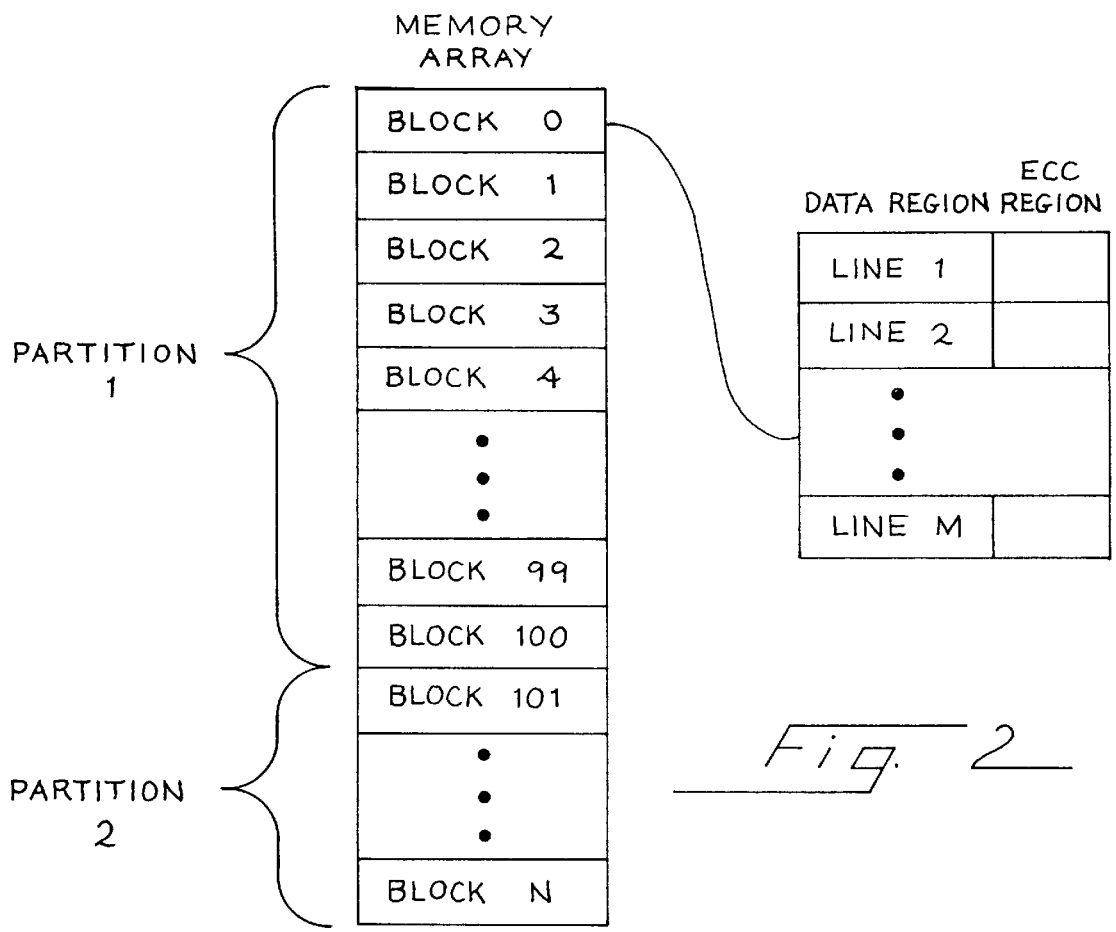
FIG. 2 is an illustration of a memory array of a preferred embodiment that is logically organized into lines, blocks, and partitions.

Turning again to the drawings, FIG. 2 is an illustration of a memory array implemented in a memory device of a preferred embodiment. In this memory array, a plurality of memory cells are logically organized into lines, blocks, and partitions. In particular, this array is logically organized into Blocks 0 to N and divided into two partitions. Partition 1 contains Block 0 to Block 100, and Partition 2 contains Block 101 to Block N. FIG. 2 also shows that Block 0 contains a plurality of lines (Line 1 to Line M), each containing a data region and an error code region. In this preferred embodiment, the error code region is an error checking and correcting ("ECC") region, and the memory device comprises a hardware component that writes an ECC code in the ECC region for each line. The ECC region is preferably hidden from the file system so that data will only be written into the data region and not into the ECC region. Accordingly, if each block contains 64 lines with each line having an 8-byte data region and a 1-byte ECC region, the file system will be able to write 512 bytes of data to each block. It should be noted that while FIG. 2 shows multiple lines, blocks, and partitions, a memory array can contain a single partition, a partition can contain a single block, and a block can contain a single line.

Dynamic Line Sizing Embodiments

In one preferred embodiment, the minimum number of memory cells that the file system can write into (i.e., the smallest writeable unit) is a single line. It should be noted that a file system "writes" into a memory cell regardless of whether the file system changes the initial digital state of the memory cell. For example, if the smallest writeable unit is 8 bytes, the file system "writes" 8 bytes of data even though some or all of the memory cells remain in their initial logic state after the write operation. Also, as noted above, the ECC region of a line is hidden from the file system so data will only be written into the data region and not into the ECC region. Accordingly, the smallest writeable unit in this preferred embodiment is the length of a line's data region (e.g., 8 bytes)—not the length of a line's data region and ECC region (e.g., 9 bytes).

To ensure that the file system writes into only the smallest writeable unit of a memory device, it is preferred that the memory device comprise an indication of its smallest writeable unit (i.e., its line size) and provide this indication to the file system. The indication can be sent in response to a read command from the file system or can automatically be sent to the file system when the data storage system is powered-up or reset. The file system can receive this indication by sensing an electronic, mechanical, or optical feature of the memory device. For example, the indication can be provided in a register in the memory array or in a device identification code of the memory device. Further, the indication can be stored when the memory device is formatted or can be prewritten into the memory device by a manufacturer of the device.

Figure 3:
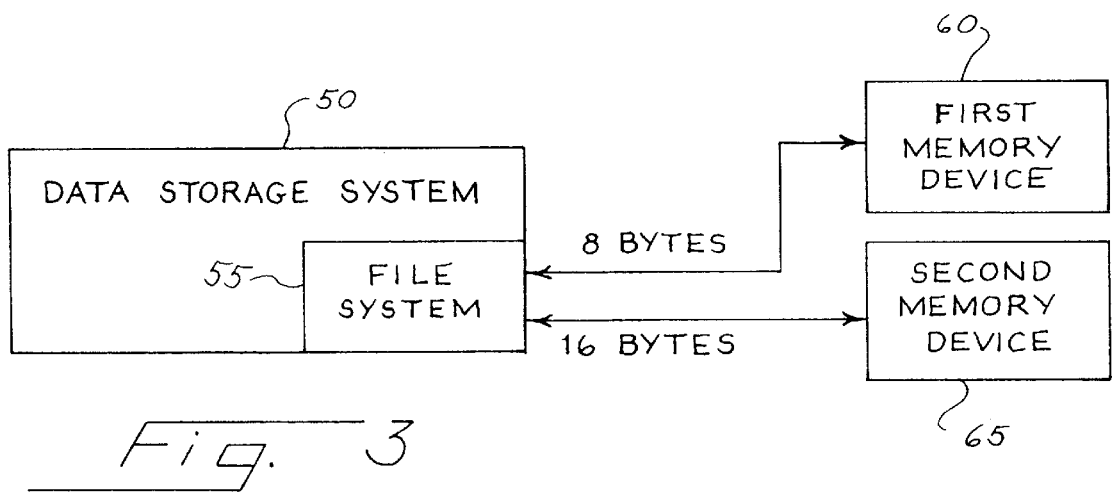
FIG. 3 is a block diagram of a data storage system and first and second memory devices of a preferred embodiment.

With this preferred embodiment, the file system dynamically responds to variability in an indicated minimum number of memory cells of respective memory devices by dynamically changing the minimum number of memory cells that the file system writes to a memory device. For example, FIG. 3 shows a data storage system 50 useable with first and second memory devices 60, 65. In this embodiment, the first and second memory devices 60, 65 take the form of modular, portable devices that are readily connected to and disconnected from the data storage system 50. The first memory device 60 has a line size of 8 bytes, and the second memory device 65 has a line size of 16 bytes. As shown in FIG. 3, when the first memory device 60 is coupled with the data storage system 50, the file system 55 is instructed to write no less than 8 bytes to the first memory device 60 during a write operation, while when the second memory device 65 is used, the file system 55 writes no less than 16 bytes during a write operation.

One advantage associated with this preferred embodiment is that variability in the smallest writeable unit is taken care of by the file system itself—not by a driver associated with the memory device. Some data storage systems use a driver to facilitate communication between the file system and a memory device coupled with the data storage system. For example, memory devices using the CompactFlash™ standard require a CompactFlash™ driver, and memory devices operating under the SmartMedia™ standard require a SmartMedia™ driver. Typically, when a new memory device is released with a smallest writeable unit that is different from that programmed into the driver, a new driver must be released and installed in the data storage system before the new memory device can be used. Because the file system of this preferred embodiment dynamically responds to the smallest writeable unit indicated by a memory device, a memory device manufacturer can redesign the smallest writeable unit of its memory device without making a new driver available for the data storage system. In this way, the file system, unlike a driver, dynamically responds to variability between the smallest writeable units of two devices.

Another advantage of this preferred embodiment relates to aligning stored data. For example, for simplicity, it may be preferred to align file structures (e.g., file name, description, and pointers) at the start of each line. If the file system were not informed of a memory device's smallest writeable unit, misalignment in the file structures may occur. For example, if the file structure is 8 bytes long, the file system would store two file structures on the 16-byte line of the second memory device 65 to maximize storage space. Because the second written file structure does not begin at the start of a line, the second file structure is not aligned with the first file structure. By informing the file system 55 that the smallest writeable unit of the second memory device 65 is 16 bytes, the file system 55 only writes the first file structure on a single line and writes the second file structure on a separate line, thereby maintaining alignment between the file structures.

Error-Code-Related Embodiments

As noted above, in one preferred embodiment, each line of the memory array contains a first set of memory cells to store data (the data region) and a second set of memory cells to store an error code representing the data stored in the first set of memory cells (the error code region). While the error code used to illustrate this preferred embodiment is an error checking and correcting ("ECC") code, it should be noted that other types of error codes (such as parity bits) can be used as an error code. In operation, when data is stored in the data region of a line, an ECC code generator determines an ECC code that represents the data, and the error code is stored in the ECC region. An ECC code generator can be implemented in hardware and/or software in the data storage system or the memory device. For example, the file system can include software to generate ECC codes, or the memory device can include a hardware component that generates ECC codes.

As described above, ECC code circuitry can be implemented external to or internal to the memory device. ECC code circuitry can impose an access time penalty approximately equivalent to 50–75 gate delays. Some memory devices implement ECC code circuitry in one or more chips separate from the memory device to avoid this penalty, which may degrade performance to an unacceptable level. Other memory devices, however, are optimized for high density and low cost and are not necessarily optimized for access speed. One such memory device is the three-dimensional, write-once electronic memory device discussed in U.S. Pat. No. 6,034,882. With these memory devices, the delays associated with integrated ECC code circuitry are relatively unimportant, and the use of integrated ECC code circuitry may be preferred since manufacturing defects and/or age-related fatigue can raise the probability of bit errors.

Figures 10A, 10B, 10C, 11:
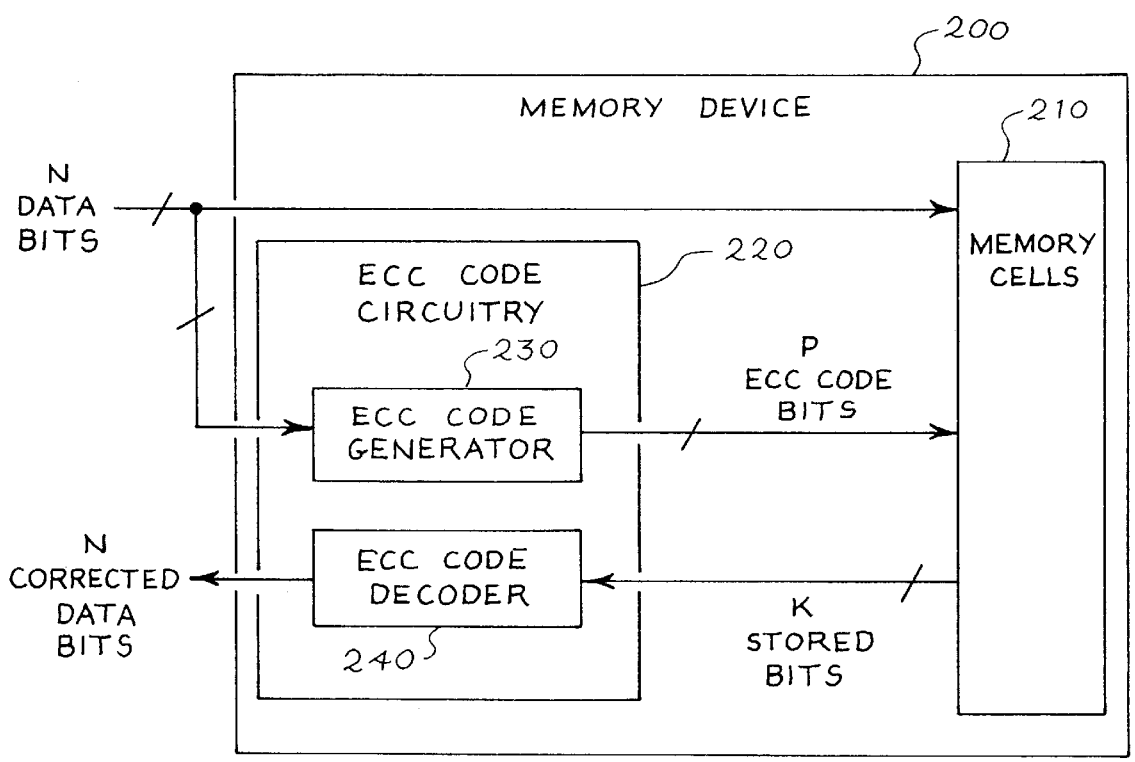
FIGS. 10a, 10b, and 10c are schematic diagrams of a plurality of memory cells illustrating a method of identifying memory cells storing data of a preferred embodiment.
FIG. 11 is an illustration of a memory device of a preferred embodiment having embedded error checking and correcting (ECC) code circuitry.

Turning again to the drawings, FIG. 11 is an illustration of a memory device 200 of a preferred embodiment. The memory device 200 can take any suitable form. In one preferred embodiment, the memory device 200 takes the form of a write-once memory device, while in another preferred embodiment, the memory device 200 takes the form of a three-dimensional electronic memory device. Some examples of electronic memory devices include, but are not limited to, a semiconductor-transistor-technology-based memory device (e.g., CMOS, bipolar, SiGe, GaAs), a magnetic-based memory device (e.g., magnetic tunnel junction (MTJ) memories), and an organic-electronics-based memory device. An optical memory device (e.g., CD-ROM) can also be used.

The memory device 200 of FIG. 11 comprises a plurality of memory cells 210 and ECC code circuitry 220 integrated with/embedded in the memory device 200. The ECC code circuitry 220 comprises an ECC code generator 230 and an ECC code decoder 240. The ECC code generator 230 accepts n data bits to be stored in the memory cells 210 as input and produces p ECC code bits as output. The n data bits are stored with the p ECC code bits as a k-bit word in the memory cells 210. Preferably the ECC code circuitry 220 implements a Hamming (k, n) code scheme (e.g., a Hamming (72, 64) code scheme).

When the k stored bits are retrieved from the memory cells 210, they are fed through the ECC code decoder 240. The ECC code circuitry 220 compares the parity bits computed from k (out of n) retrieved bits and compares those parity bits with the ones stored. If there is a mismatch, the ECC code circuitry 220 corrects the error (if one bit). The n corrected data bits are then outputted by the ECC code decoder 240. With a Hamming (72, 64) code scheme, the 8 ECC code bits are used to identify and correct any single-bit error in the 72-bits of stored data. (The presence of two errors in the 64-bit word can be determined but not corrected.) Accordingly, the Hamming (72, 64) code scheme permits the memory device 200 to tolerate one defective bit out of every 72 bits. This defect rate (about 1.4%) exceeds the defect percentages encountered in typical integrated circuit manufacturing.

In one preferred embodiment, the data bits and ECC code bits are stored in memory cells using the distributed data strategy described in U.S. patent application Ser. No. 09/747,574 (pending), filed on the same date as the present application. That application, which is assigned to the assignee of the present invention, is incorporated by reference herein. U.S. patent application Ser. No. 09/748,649 (pending), which is also assigned to the assignee of the present invention and incorporated by reference herein, provides additional information concerning these concepts.

As described above, an ECC code generator implements an algorithm (preferably based on the Hamming Code) to generate an output using the data to be stored in the data region as input. When data is written into and/or read from the data region, the written/read data is compared to the ECC code. For example, when data is read from the data region, the ECC generator can generate an ECC code based on the read data and compare that newly-generated ECC code with the ECC code stored in the ECC region. An error indication is provided to the data storage system if the ECC codes do not match. The ECC codes can then be decrypted to determine which bit(s) in the data is incorrect so that the erroneous bit(s) can be corrected. There are situations, however, where a mismatch between the newly-generated ECC code and the ECC code stored in the ECC region does not indicate an error. One such situation can occur with write-once memory devices.

In spite of its many advantages, a write-once memory array provides the disadvantage that a memory cell cannot be erased once it is written into. Accordingly, it is not possible to erase files from a write-once memory array by restoring the associated memory cells to their initial, un-programmed digital state (e.g., Logic 0). Novel methods for deleting stored data from write-once memory devices are presented in U.S. patent application Ser. No. 09/638,439 (pending), filed Aug. 14, 2000, which is assigned to the assignee of the present invention and is hereby incorporated by reference. As described in that patent application, data can be deleted (i.e., made difficult or impossible to read) by overwriting at least a portion of the stored data with a destructive pattern. This destructive pattern switches at least some of the memory cells associated with the stored data from an original, un-programmed state to a programmed state. For example, some or all of the memory cells associated with stored data can be over-written with the destructive pattern (1111111). Any suitable destructive pattern (periodic or aperiodic) that achieves the desired result of obliterating the data can be used.

Figure 4A:
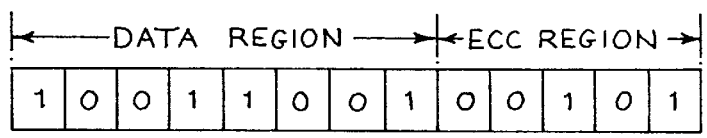
FIGS. 4a, 4b, and 4c are schematic diagrams of a plurality of memory cells of a write-once memory device of a preferred embodiment.
Figure 4B:
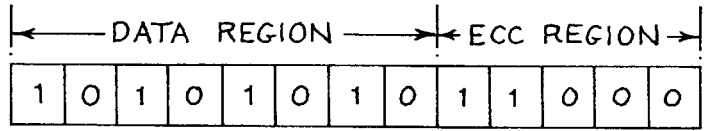
Figure 4C:
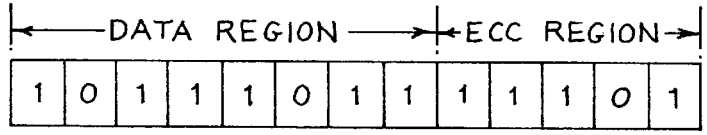

FIGS. 4a through 4c provide a specific example of this operation for a write-once memory. FIG. 4a shows data (10011001) stored in the data region of a line. The error code representing the data (00101) is stored in the ECC region. To delete or obliterate this data, the destructive pattern (10101010) shown in FIG. 4b is written into the data region of the line. Because the memory device is a write-once device, only the un-programmed bits are affected by this write operation. Accordingly, the data stored in the data region after the destructive pattern is written is the OR of the original data (10011001) and the destructive pattern (10101010). The result (10111011) is shown in FIG. 4c. When the destructive pattern is written into the data region, the error code representing that pattern ((11000), as shown in FIG. 4b) is also written into the ECC region of the line. However, because only un-programmed bits are affected by a write operation in a write-once memory device, the resulting error code in the ECC region will be the OR of the original ECC code (00101) and the ECC code of the destructive pattern (11000). The result ((11101), shown in FIG. 4c), however, does not represent the data stored in the data region (10111011). Accordingly, a comparison of the ECC code with the data stored in the data region will indicate a false error. Such a false error may have the undesired effect of re-writing or correcting the data properly stored in the data region.

To overcome this problem, it is preferred that the file system disregard the error code for "deleted" data. For example, an indication that the data is deleted can be stored by the file system in the form of a flag bit designated in a file listing or an entry stored in a table of deleted data. In this way, to determine whether data is deleted data, the file system determines whether such an indication was stored. Alternatively, the file system can recognize deleted data by recognizing that the data stored in the data region is the destructive pattern. For example, if the destructive pattern is a series of 1's, the resulting data will also be a series of 1's. If the error codes do not match in this situation, it is likely that the data is deleted data, and the file system can disregard the error code. "Disregard the error code" is intended to broadly refer to any act or omission that prevents the undesired effect of re-writing or correcting the data properly stored in the data region. For example, an error code can be disregarded by disabling a comparison of the data stored in the data region with the error code or can be disregarded by ignoring an error resulting from such a comparison.

It is should be noted that the set of memory cells can be other than a data region of a line. For example, the set of memory cells storing data can be a block of lines. Also, while the error code region was associated with a single line in the above-described preferred embodiment, an error code region can be associated with a block of lines or with a file. Further, the term "set" is intended to refer to one or more, and the un-programmed digital state can be either Logic 0 or Logic 1 (or Logic 2 in a three-state digital system).

Micro-Allocator Embodiments

Figure 5:
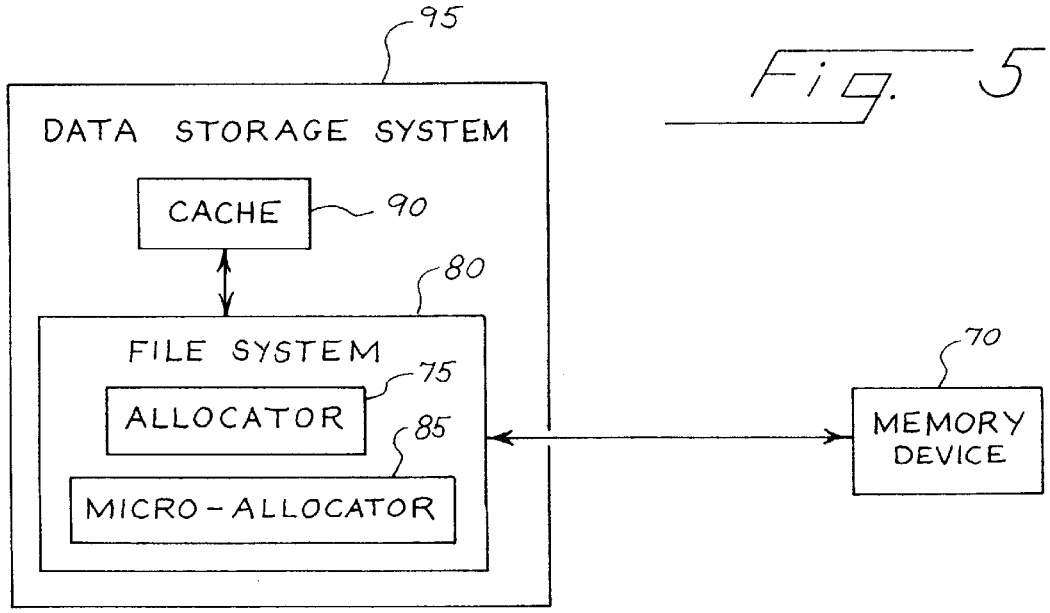
FIG. 5 is a block diagram of a data storage system and memory device of another preferred embodiment.

As described above, in one preferred embodiment, the memory device is logically organized into a plurality of blocks, each block comprising a plurality of lines. The term "block" as applied to memory cells refers to a contiguous set of memory cells. With reference to FIG. 5, to store a file in a memory device 70, an allocator 75 of a file system 80 determines the size of the file that is to be stored and allocates an appropriate number of blocks in the memory device 70 for storing the file. As shown in the example illustrated in FIG. 6, Blocks 1–4 are allocated for a first file. Although four blocks are allocated, the first file may not completely fill one of the blocks. This may occur, for instance, with a small file or with a large file that has been segmented into smaller portions. This may also occur with a small remainder of a file after it has already filled other blocks, as illustrated in Block 4 of FIG. 6. The first file only partially fills Block 4, leaving Lines 4–6 available. Because the allocator 75 only allocates memory in block units, when a second file is to be stored in the memory device 70, the allocator 75 allocates additional blocks for the second file (e g, Blocks 5–10) and leaves the available space in Lines 4–6 of Block 4 unfilled.

To prevent wasting of available memory space, it is preferred that the file system 80 comprise a micro-allocator 85 to keep track of a block (preferably, each block) and report which lines have been used (or which lines are available) to a block-tracking device such as an allocation table. This provides the advantage of using lines that otherwise would have been wasted. With the use of a micro-allocator 85, available Lines 4–6 can be used to store a second file, as shown in FIG. 6. If there are remaining portions of the second file to be stored, the allocator 75 would then determine the size of the remaining portions and allocate an appropriate number of blocks in the memory device 70. The remaining portions of the second file would then be stored in the allocated blocks, with the micro-allocator 85 determining which lines are available in the allocated block. As is clear from this example, the term "file" refers to either a complete file or a portion of a file, such as the portion of the first file stored in Lines 1–3 of Block 4.

In an alternate embodiment, instead of allocating blocks in the memory device 70 itself, the allocator 75 can allocate blocks in a memory cache 90 (e.g., RAM) of the data storage system 95. In this way, data can be cached prior to actually committing it to the memory device 70. In this embodiment, the allocator 75 would allocate blocks held in the cache 90, the micro-allocator 85 would track line usage of the cached block, and the file system 80 would store the cached data in the memory device 70 when the cached block is full. Use of this alternate embodiment may be especially desired when the memory device 70 takes the form of a write-once memory device. Because stored data cannot be over-written in a write-once memory device, the file system cannot re-organize stored data as it can with a write-many memory device. By using this preferred embodiment, the allocator 75 can allocate a number of blocks into the cache 90, and the file system 80 can use the cache 90 as a workspace in which to write and re-write data. For example, if the blocks of FIG. 6 were allocated in the cache 90, the file system 80 could move Lines 4–6 of Block 4 to another block closer to the remainder of the second file. The micro-allocator 85 could then indicate that Lines 4–6 were available for additional data. After those lines are filled, the file system 80 could store Block 4 in the write-once memory device. Of course, a cached block can be written to the memory device before the cached block is filled.

"Skid Pad" Embodiments

As described above, when a file is stored to the memory device, the allocator determines how many blocks to allocate in the memory device. After the file is stored, the file system stores a file structure for that file in the memory device. The term "file structure" is intended to refer to data that describes a file. In one embodiment, a file structure describes a file and how a file system can use the file. For example, a file structure can describe the name, type, location, size, and other attributes of a file, as well as the type of commands that a file system can or cannot use with that file. For instance, a file structure can indicate that a file is "read-only" and, accordingly, cannot be modified by a file system. As another example, the file structure can be a file "footer," which can be a data pattern indicating that the file stored in the block is complete or a pointer to a memory location storing the next portion of the file (or to a table storing such a pointer). Of course, other file structures in addition to these examples can be used.

Because file structures are written after a file is stored in memory, problems can arise with write-once memory devices if all of the allocated space for that file is filled before the file structures can be written. For example, if the data storage system records a digital representation of streaming data (e g, voice data), the streaming data can fill the entire allocated memory space, leaving no room for file structures. Because file structures have not been written, when the file system reads the stored data, it will not know whether the file is complete or where to look for the additional portions of the file. A similar problem is encountered if a catastrophic failure occurs during the write operation (such as a power failure or a user removing the memory device from the data storage system). With a write-many memory device, the file structure can be stored at another memory location, and the file system can later re-organize the stored data to place the file structure with the stored file. However, this re-organization is not possible with write-once memory devices.

To overcome this difficulty, when the file system writes a file to a block (or any other type of contiguous set of memory cells, such as a line), the file system preferably reserves at least one memory cell in the block for file structures for that file. In this way, the file system creates a "skid pad" in the block for the file structures. It is preferred that this "skid pad" not be visible to an end user so that files too large to fit in the unreserved memory cells will not be attempted to be written into the reserved memory space.

The use of a "skid pad" will now be illustrated in conjunction with FIGS. 7a-7c. As shown in FIG. 7a, Line 6 of a block is reserved for file structures of a file to be saved in that block. The number of memory cells reserved for file structures can be determined by the file system. When a file is stored in the block, only those lines that are not reserved for the file structures are used to store the file (Lines 1–5). If the file is more than five lines long, the file structure for the file is stored in Line 6, as shown in FIG. 7b. If the file structure can be stored in the unreserved memory cells, the reserved memory cells can be used to store other data. For example, if Line 6 in FIG. 7a were reserved for the file structures of a first file and the file system were able to save file structures for the file in an unreserved line (as shown in FIG. 7c), Line 6 can be used to store other data. In FIG. 7c, Line 6 is "re-used" as reserved space for the file structures of a second file being stored to that block.

Figures 8A, 8B:
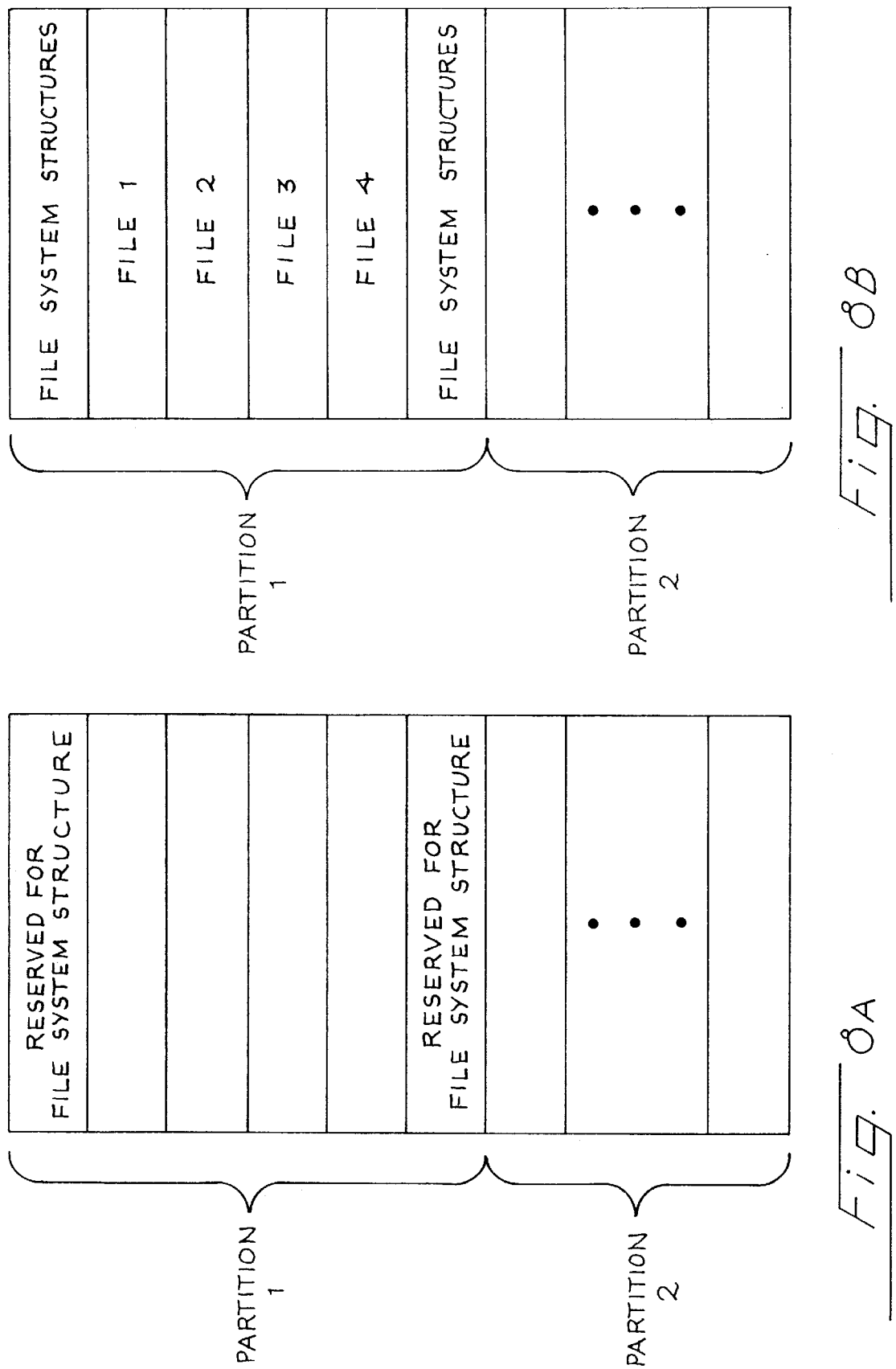
FIGS. 8a and 8b are illustrations of how file system structures of a partition are reserved in a memory device of a preferred embodiment.

The "skid pad" concept can also be used for file system structures. Whereas a file structure refers to data that describes a particular file, a "file system structure" refers to any data that describes a partition in memory, the memory space within the partition, and/or the type of commands that a file system can or cannot use with that partition. For example, a file system structure can be data describing where a file resides and can be used by a file system to find that file or free memory cells in a memory device. As another example, a file system structure can indicate that a partition is "closed" and, accordingly, cannot be modified by a file system. A file system structure can take the form of an allocation table, a listing of stored files, a search tree, a boot block, a partition header, a partition footer, a description of contents of the memory device, and configuration information, as well as a listing of the file structures of the files stored in a partition. Of course, other file system structures in addition to those listed above can be used. FIGS. 8a and 8b illustrate this embodiment. When the file system creates a partition in the memory device, the file system reserves at least one memory location for file system structures of the partition (here, the first and last block of the partition). The file system stores files in the partition in any unreserved memory location, as shown in FIG. 8b. In this way, if the partition is completely filled with files, there will be room for file system structures of the partition. Further, a file system may expect to find file system structures at certain memory locations. Reserving space in the memory for file system structures ensures that other data (such as a file) will not be written into those locations.

Multiple-File-System-Structures Embodiments

Figure 9A:
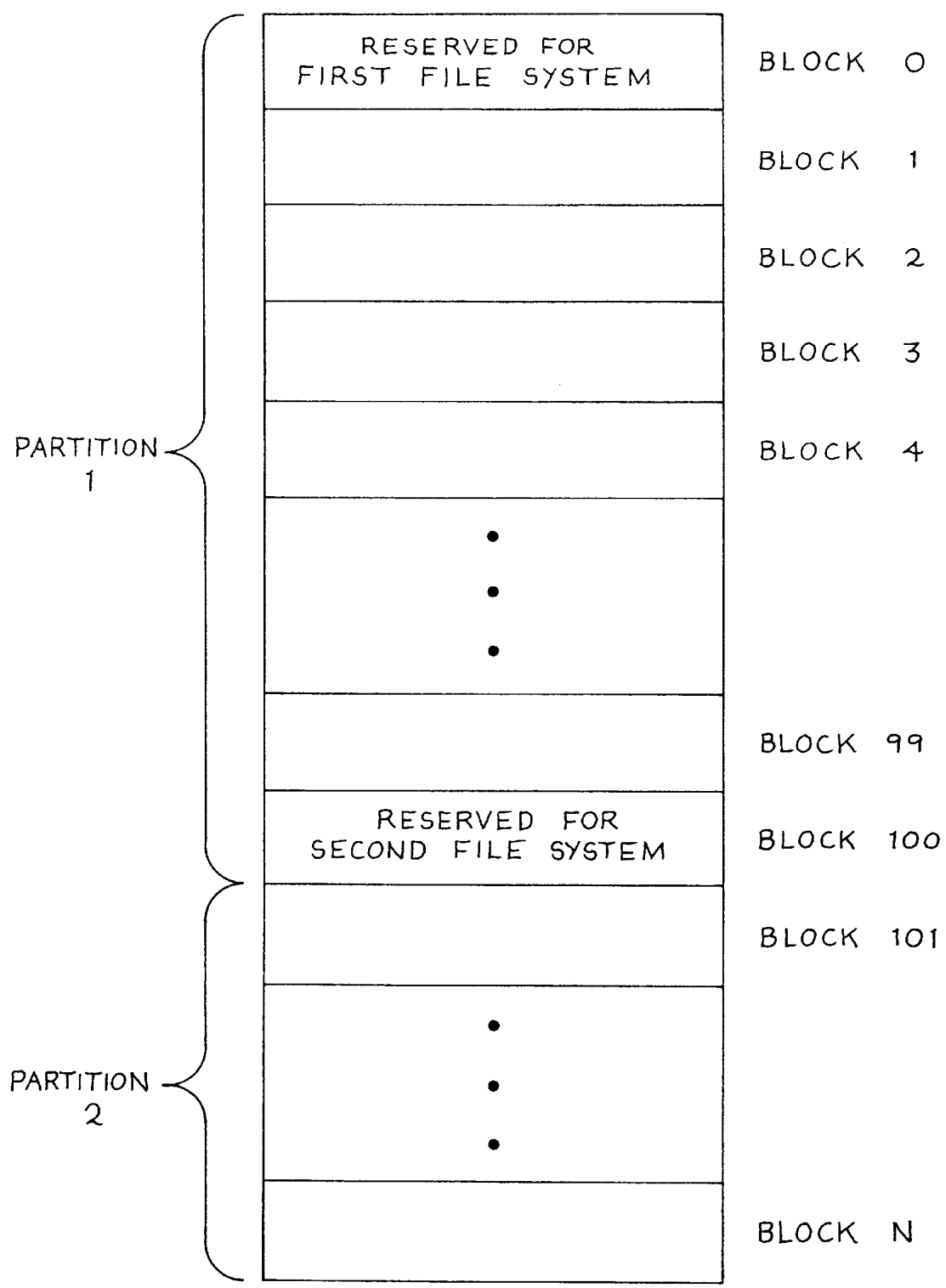
FIGS. 9a and 9b are illustrations of a memory device of a preferred embodiment in which file system structures of two file systems are stored in a single memory partition.
Figure 9B:
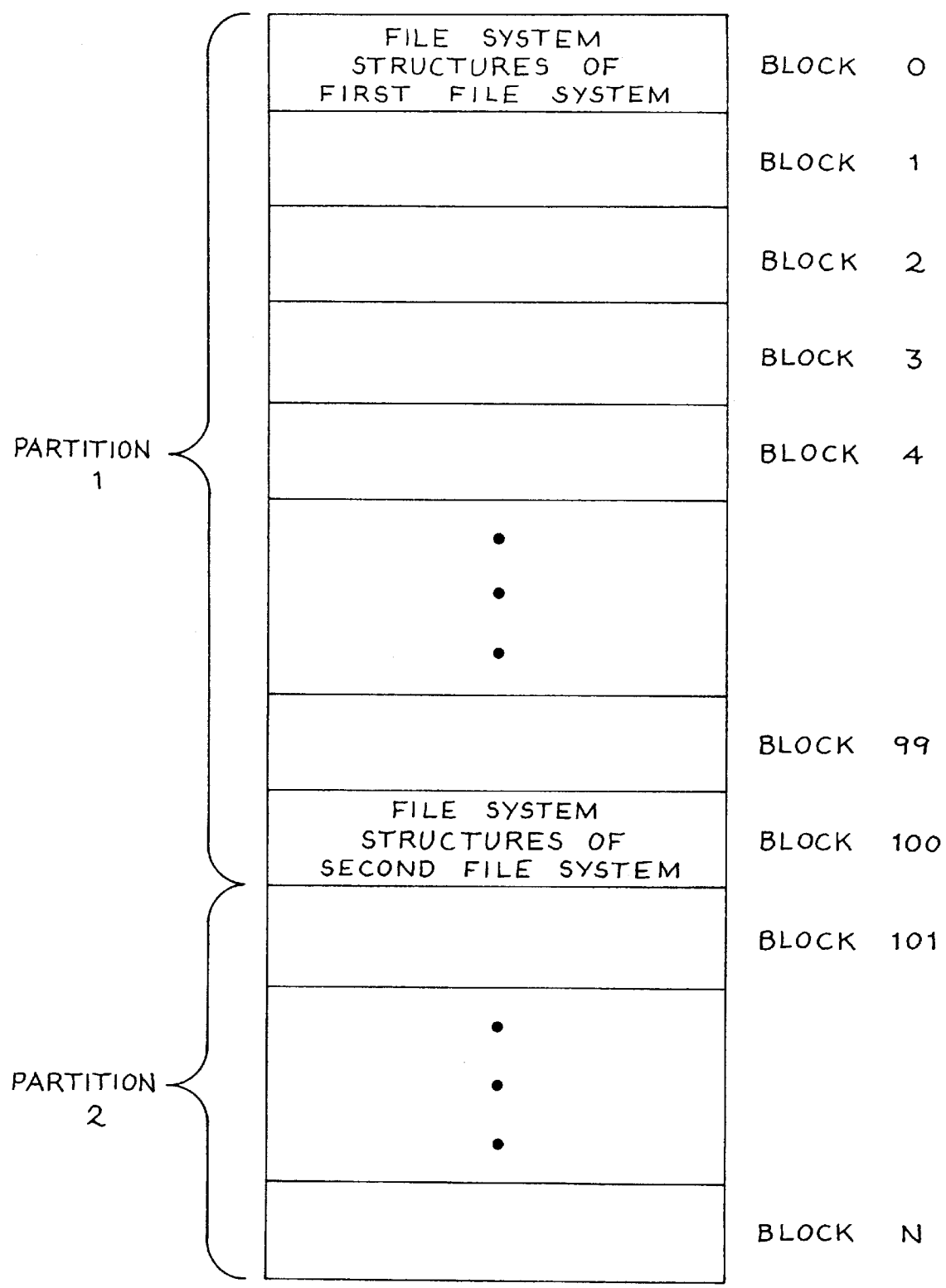

In another preferred embodiment, a memory device is presented where file systems structures for two or more different file systems are stored in the same partition of a memory device, such as the memory device shown in FIG. 9b. Preferably, a partition comprises a set of memory cells with a single addressing scheme. By storing file systems structures for multiple file systems in the same partition of a memory device, the memory device can be read by a larger number of media readers. For example, a data storage system such as a digital camera can store file system structures for multiple file systems to ensure that pictures stored on the memory device can be read by a prominent file system. In operation, once the memory device is filled with pictures and file system structures of one file system are stored in the memory device, the digital camera can "close" the memory device by storing file system structures of additional file systems. For example, the camera can store DOS FAT file structures (e.g., FAT Table, boot sector, etc.) so that the memory device can be read on any DOS reader as well as a reader using the primary file system.

The file system structures for the additional file systems can be written to the memory device in response to a request from a user, such as when the user provides an indication to the data storage system that he does not want to store any more data on the memory device. In response to this indication, the file system or another application of the data storage system can add the file system structures for the other file systems. Alternatively, the file system can automatically write the additional file system structures when the file system detects that the memory device is full or virtually full.

With write-once memory devices, if the locations for file system structures of a file system are written with data, the file system structures of that file system will not be able to be written onto the memory device. Accordingly, to leave open the option of writing additional file system structures of other files systems, the "skid pad" concept discussed above can be used. That is, after a partition is created in the memory device, memory cells are reserved in the appropriate locations in the partition for file system structures of the additional file systems. As an example, if one wanted to close the memory device to be DOS FAT compatible, the first address of the memory device would be reserved for the boot sector structure. As a simplified example of this, consider FIGS. 9a and 9b. FIG. 9a shows that Block 0 in Partition 1 is reserved for file system structures of a first file system and that Block 100 in Partition 1 is reserved for file system structures of a second file system. The file system structures of the first and second file systems are later stored in their respective reserved locations, as shown in FIG. 9b. While FIG. 9b shows file system structures of two file system stored in a single partition in the memory device, it should be noted that file system structures of more than two file systems can be stored.

Closing-The-Media Embodiments

In another preferred embodiment, data stored on a memory device, such as a file or a partition, is permanently prevented from being modified (i.e., the data is "locked" or "closed"). In many situations, it is desirable to modify data stored in a memory device. However, there are other situations in which one wishes to prevent the stored data from ever being modified. For example, consider the situation in which a memory device stores executable code (e.g., for a video game or a digital book) in one partition and user information (e.g., for high scores or notes) in another partition. In this situation, it may be desired to prevent the executable code from being modified. As another example, it may be desired to prevent user-stored information (such as a picture taken with a digital camera) from being erased or changed once it is stored. Some re-writeable media, such as hard disks, can store a read-only or an archive flag along with data that is to be protected from modification. However, because such flags can removed, this method of protection does not ensure that the data will never be modified. Further, the use of write-once media alone does not ensure permanent protection of data because, as described above, stored data can be modified by overwriting the data with a destructive pattern (i.e., switching memory cells from an un-programmed to a programmed state).

In one preferred embodiment, a file is permanently prevented from being modified by storing an indicator in a file structure of the file. Any file system reading that file structure would be prevented from modifying the file and would be programmed to prevent modification or removal of the indicator. Alternatively, if a write-once memory device is used, the media itself ensures that the indicator is non-modifiable if the indicator is in a programmed state. In another preferred embodiment, a partition is permanently prevented from being modified by permanently preventing the file system from allocating memory cells in the protected partition. In one implementation, the file system's allocator is disabled, thereby preventing the file system from allocating any blocks of memory in the partition. In another implementation, the file system's allocator is replaced by another allocator that is given no space to allocate. Similar to protecting files, a partition can be permanently protected by storing an indicator in a file system structure of the partition, and a file system reading that file system structure would be prevented from modifying the partition. As above, a file system can be programmed to prevent modification or removal of this indicator or, if a write-once memory device is used, the media itself ensures that the indicator is non-modifiable if the indicator is in a programmed state. With these preferred embodiments, the protected data (files or partitions) is permanently and finally "locked" or "closed."

Temporal-To-Spatial Mapping Embodiments

Turning again to the drawings, FIGS. 10a–10c illustrate a method for identifying memory cells storing data in a memory device of a preferred embodiment. This method provides the advantage of locating stored data when the location of the data is not known to the file system a priori. FIG. 10a shows a set of memory cells. The first line of memory cells stores data (1101), and the remaining five lines of memory cells store an identification pattern (0000). FIG. 10b shows additional data (1110) stored in the second line of memory cells (i.e., between the memory cells storing the previously-stored data (1101) and the memory cells storing the identification pattern (0000)) by overwriting the identification pattern stored in the second line. To identify the memory cells that store the newly-written data (1110), the file system identifies those cells that are adjacent to the memory cells storing the identification pattern. For example, the file system can be programmed to identify the memory cells that are within a predetermined number of memory cells adjacent to the memory cells storing the identification pattern (eg., four memory cells or one line). Alternatively, the file system can be programmed to identify the memory cells that are between two sets of memory cells storing the identification pattern. For example, in FIG. 10c, data (0110) and (1001) are identified because they are located between the memory cells storing the identification pattern (0000) in the third and sixth lines of the memory array.

This method for identifying memory cells provides particular advantages for write-once memory devices. These advantages will be discussed in terms of storing data describing a file. It should be noted that the method and its associated advantages are equally applicable to other applications. File listings in a memory device often store the name and attributes (such as date and time created, read-only, executable, etc.) of a file and a pointer listing the address where the file is actually contained in the memory. If the file is later moved in memory, the file system simply writes the new address of the file over the old address of the file. Similarly, if a new file is later stored at the address indicated by the pointer, the file system can write the name of the new file over the name of the old file. Accordingly, if data changes after it is stored, the modified data is written over the previously-stored data at the same location. This technique of modifying data will be referred to as temporal mapping—although data changes at a later time, its location remains the same. For this reason, the file system knows exactly where to locate data. For example, the pointer to a specific file will always be in the same location regardless of whether the pointer to that file changes.

Because a write-once memory device cannot re-write over a previously-written location, the temporal mapping technique described above cannot be used with a write-once memory device. Instead, new data is written to a new location. When new data is written, it is preferred that the old data be deleted using the deletion method described above and in U.S. patent application Ser. No. 09/638,439 (Attorney Docket No. 10519/4) (pending), filed Aug. 14, 2000, to ensure that the file system does not recognize the original data (e.g., pointers) as the current data. To determine the location of the new data, it is preferred that the identifying technique described above be used. This technique will be referred to as spatial mapping (in contrast to temporal mapping)—when data changes at a later time, its location also changes.

Turning again to FIGS. 10a–10c, data (1101) represents a pointer to a particular file. Here, the memory cells storing the identification pattern are all in an un-programmed logic state (e.g., Logic 0). When the location of the file changes, a new pointer (1110) is written to the memory device (see FIG. 10b) by overwriting the identification pattern in the next available line. To identify the location of the new pointer, the file system locates the memory cells that are adjacent to the memory cells in the un-programmed Logic 0 state. That is, the file system recognizes the string of zeros to mean that the data stored before the string of zeros is the current data. In this way, writing new pointers over existing zeros, while leaving more zeros at the end of the memory cells, allows the file system to recognize which pointers are the most current. In essence, the task of finding the most current data reduces to merely finding the last nonzero entry in the memory cells. If the entire set of memory cells storing an identification pattern is overwritten, additional modifications may not be possible. To avoid this situation, it is preferred that the pointer point to an additional pointer tree (instead of to the file itself) to increase the number of modifies that can occur.

In the preceding example, it was assumed that the file system was programmed to identify a line of data that is adjacent to the memory cells storing the identification pattern. In this way, the identified data was of a predetermined size (i.e., a predetermined number of memory cells, such as a line). To identify data of a variable size, the file system can be programmed to identify memory cells that are between two sets of memory cells storing the identification pattern, as shown in FIG. 10c. Additionally, when the old data is deleted with a destructive pattern that results in a predetermined pattern of data being stored in the old location (e.g., a string of ones), the file system can be programmed to identify the memory cells that are between a set of memory cells storing the predetermined pattern of data (e.g., the string of ones) and a set of memory cells storing the identification pattern (e.g., the string of zeros). In this situation, the file system is preferably programmed to ignore the predetermined pattern rather than recognize it as valid data.

Although the spatial mapping technique was illustrated above in conjunction with file descriptors and pointers, this technique can be used in any other suitable application in which data is updated. For example, this technique can be used in a calendaring application (where entries to a particular time or date in a calendar change over time) or in a picture editing application (where new picture are stored) run by a data storage system coupled with the memory device. The above description of the operation and advantages of this technique applies equally to these other applications. Additionally, while the preceding illustration used a string of 0s as an identification pattern, other identification patterns can be used to achieve the desired result of identifying stored data. For example, instead of the identification pattern being a string of memory cells in their un-programmed logic state (e.g. Logic 0), the identification pattern can be a string of memory cells, some of which are in their un-programmed logic state and some of which are in a programmed logic state (e.g., (0011)).

In another preferred embodiment, the location of data stored in a first set of memory cells of a memory device is identified by an identifier that is stored adjacent to the data. For example, an identifier can be stored in the middle or at an end (the beginning or the end) of the stored data. The identifier would instruct the file system how much memory on one or both sides of the identifier is data. The identifier can be fixed or dynamic. For example, instead of using the same identifier each time new data is written to the memory device, the identifier can change to indicate that new data is being written or to indicate how many times new data has been written to the memory device. In one embodiment, the length of the identifier changes with each new data write, while in another preferred embodiment, data stored in the identifier itself changes. For example, an incrementing, multiplying, or incrementing alternating pattern can be used to provide the indication. In yet another preferred embodiment, the identifier is added to the end of the stored data indicating whether the stored data is valid or invalid. For example, one bit can be added to a line or block. If the bit is not present, the file system would know that the preceding data is valid. Conversely, if the bit is present, the file system would ignore the data.

The forgoing detailed description has described only a few of the many possible implementations of the present invention. For this reason, this detailed description is intended by way of illustration, and not by way of limitation. It is only the following claims, including all equivalents, that are intended to define the scope of this invention.

What is claimed is:

1. A method or overwriting data in a memory device comprising a first and second set of memory cells, the method comprising:
   (a) storing data in a first set of memory cells in a memory device;
   (b) storing an error code in a second set of memory cells in the memory device, the error code representing the data stored in the first set of memory cells;
   (c) writing a destructive pattern into at least some of the first set of memory cells, wherein the error code no longer represents the data stored in the first set of memory cells after the destructive pattern is written and wherein the destructive pattern introduces an error in the data that is correctable by the error code stored in the second set of memory cells;
   (d) storing a flag in a third set of memory cells in the memory device indicating that the data is deleted data;
   (e) with a file system, determining whether the flag was stored in the third set of memory cells; and
   (f) if the file system determines that the flag was stored in the third set of memory cells, allowing the data to remain uncorrected even though the error is correctable.

2. The method of claim 1, wherein the flag is designated in a file listing.

3. The method of claim 1, wherein the flag is stored as an entry in a table.

4. The method of claim 1, wherein the error code comprises an error checking and correcting (ECC) code.

5. The method of claim 1, wherein the memory device is logically organized into a plurality of lines, and wherein a line comprises the first and second sets of memory cells.

6. The method of claim 1, wherein the first set of memory cells comprises a minimum number of memory cells that can be written into during a write operation.

7. The method of claim 1, wherein the memory device comprises a write-once memory device.

8. The method of claim 1, wherein the memory device comprises a three-dimensional write-once memory device.

9. A method for overwriting data in a memory device comprising a first and second set of memory cells, the method comprising:
   (a) storing data in a first set of memory cells in a memory device;
   (b) storing an error code in a second set of memory cells in the memory device, the error code representing the data stored in the first set of memory cells;
   (c) writing a destructive pattern into at least some of the first set of memory cells, wherein the error code no longer represents the data stored in the first set of memory cells after the destructive pattern is written and wherein the destructive pattern introduces an error in the data that is uncorrectable by the error code stored in the second set of memory cells;
   (d) storing a flag in a third set of memory cells in the memory device indicating that the data is deleted data;
   (e) obtaining an error when attempting to correct the data using the error code;
   (f) with a file system, determining whether the flag was stored in the third set of memory cells; and
   (g) if the file system determines that the flag was stored in the third set of memory cells, ignoring the error obtained in (e).

10. The method of claim 9 further comprising:
    (h) if the file system determines that the flag was not stored in the third set of memory cells, returning the data despite the presence of the uncorrectable error.

11. The method of claim 9, wherein the flag is designated in a file listing.

12. The method of claim 9, wherein the flag is stored as an entry in a table.

13. The method of claim 9, wherein the error code comprises an error checking and correcting (ECC) code.

14. The method of claim 9, wherein the memory device is logically organized into a plurality of lines, and wherein a line comprises the first and second sets of memory cells.

15. The method of claim 9, wherein the first set of memory cells comprises a minimum number of memory cell that can be written into during a write operation.

16. The method of claim 9, wherein the memory device comprises a write-once memory device.

17. The method of claim 9, wherein the memory device comprises a three-dimensional write-once memory device.

* * * * *

UNITED STATES PATENT AND TRADEMARK OFFICE
CERTIFICATE OF CORRECTION

PATENT NO. : 6,647,471 B2  Page 1 of 1
DATED : November 11, 2003
INVENTOR(S) : Roger W. March et al.

It is certified that error appears in the above-identified patent and that said Letters Patent is hereby corrected as shown below:

<u>Title page,</u>
Item [56], References Cited, U.S. PATENT DOCUMENTS, insert the following:
-- 6,226,241 B1    05/2001    D'Amato et al.
   6,282,605 B1    08/2001    Moore
   6,446,073 B1    09/2002    D'Amato et al.
   6,530,009 B1    03/2003    James --.

Signed and Sealed this

Sixteenth Day of November, 2004

JON W. DUDAS
*Director of the United States Patent and Trademark Office*